United States Patent
Kotooka et al.

[11] Patent Number: 5,935,326
[45] Date of Patent: Aug. 10, 1999

[54] APPARATUS FOR MANUFACTURING SEMICONDUCTOR SINGLE CRYSTALS

[75] Inventors: Toshirou Kotooka; Toshimichi Kubota; Makoto Kamogawa; Yoshiyuki Shimanuki, all of Kanagawa, Japan

[73] Assignee: Komatsu Electronic Metals Co., Ltd., Kanagawa, Japan

[21] Appl. No.: 08/975,678

[22] Filed: Nov. 21, 1997

[30] Foreign Application Priority Data

Nov. 21, 1996 [JP] Japan .................................. 8-326139

[51] Int. Cl.⁶ ............................................. C30B 35/00
[52] U.S. Cl. .................... 117/217; 117/218; 117/222; 117/900
[58] Field of Search ..................... 117/200, 213, 117/217, 218, 222, 900

[56] References Cited

U.S. PATENT DOCUMENTS

| | | | |
|---|---|---|---|
| 4,544,528 | 10/1985 | Stormont et al. | 117/217 |
| 4,597,949 | 7/1986 | Jasinski et al. | 117/217 |
| 5,268,061 | 12/1993 | Sunwoo et al. | 117/217 |
| 5,394,825 | 3/1995 | Schmid et al. | 117/13 |
| 5,720,810 | 2/1998 | Arai et al. | 117/217 |

FOREIGN PATENT DOCUMENTS

| | | | |
|---|---|---|---|
| 405294782 | 11/1993 | Japan | 117/217 |
| 6-144987 | 5/1994 | Japan | C30B 15/14 |
| 6-183876 | 7/1994 | Japan | C30B 15/14 |
| 6-211591 | 8/1994 | Japan | C30B 15/00 |
| 6-279188 | 10/1994 | Japan | C30B 29/06 |
| 6-287098 | 10/1994 | Japan | C30B 15/14 |

*Primary Examiner*—Felisa Hiteshew
*Attorney, Agent, or Firm*—Sughrue, Mion, Zinn, Macpeak & Seas, PLLC

[57] ABSTRACT

An cylindrical after-heater surrounding a single crystal being lifted and a cylindrical heat-retaining cylinder installed between the after-heater and the single crystal are provided above a reversed frustrated heat-shielding sleeve disposed near the melted liquid. The heat history of the single crystal can be controlled by adjusting the output of the after-heater and the location of the heat-retaining cylinder. By such an arrangement, rapid respond to the change of the heat environment in a furnace can be made and control of the temperature gradient of the single crystal can be achieved. The single crystal, throughout the whole length, is maintained in the range of from 1000° C. to 1200° C. for more than one hour during lifting operation.

5 Claims, 4 Drawing Sheets

APPARATUS FOR MANUFACTURING SEMICONDUCTOR SINGLE CRYSTALS

BACKGROUND OF THE INVENTION

1. Field of the Invention

The present invention relates to a device and a method for manufacturing semiconductor single crystals by utilizing the Czochralski method(hereinafter referred to as the CZ method). According to this invention, the as-grown defect density of the single crystals manufactured can be reduced and the gate oxide film integrity can thus be enhanced.

2. Description of the Related Art

The substrates of semiconductor components are mainly made of high-purity silicon single crystal that is conventionally produced by the CZ method. In the CZ method, polycrystalline silicon lumps are filled into a crucible of a semiconductor single-crystal manufacturing device. Then thecrucible is heated by cylindrical heaters disposed therearound to melt the polycrystalline silicon lumps, thereafter a seed crystal installed on a seed chuck is dipped into the melted liquid. After that, the seed chuck and the quartz crucible are respectively driven to rotate in opposite or identical directions, and at the same time the seed chuck is lifted to grow a single-crystal silicon ingot of predetermined diameter and length.

The quality characteristics of the single-crystal silicon produced by the CZ method, such as the gate oxide film integrity, the precipitation oxygen amount, and the bulk micro defect, are depending on the heat history of the single-crystal silicon produced. Therefore, till now many improvements to the above-mentioned heat history has been made. For example, according to a method for manufacturing single crystals disclosed in Japanese Patent Unexamined Publication No. HEI 6-211591, an annular heater heated by electric power from a heating control device is supported by a support member which also serves as an electrode. The gate oxide film integrity can be enhanced by slowly cooling down the outer peripheral surface of the single-crystal silicon being lifted, and further the precipitation oxygen amount also can be made even. Furthermore, the heat history of the single-crystal silicon can be positively adjusted by changing the heating value of the above annular heater at a discretionary manner.

Furthermore, according to a method for lifting single crystals disclosed in Japanese Patent Unexamined Publication No. HEI 6-279188, a predetermined zone of a silicon single crystal being lifted is heat-treated by a multi-stage heater. According to a device for growing single crystals disclosed in Japanese Patent Unexamined Publication No. HEI 6-144987, reheat heaters are disposed in a gas rectifier which is used for guiding atmosphere gas into the chamber. In addition, according to a device for lifting single crystals disclosed in Japanese Patent Unexamined Publication No. HEI 8-119786, the heat history of single crystals produced is controlled by disposing an after-heater and coolers located above and below the after-heater around single crystals being lifted. According to a device for lifting single crystals disclosed in Japanese Patent Unexamined Publication No. HEI 6-287098 entitled, slits are formed in radiation shield cylinder installed in the furnace. Radiation heat coming from the furnace is guided through the slits to radiate on a specified portion, which should be cooled down slowly, of the single crystal being lifted.

The inventors of this invention have suggested a device and a method for lifting single crystals disclosed in Japanese Patent Unexamined Publication No. HEI 6-183876, in which an upper heater is installed above the melted liquid. The above suggestion is different from the above-mentioned lifting methods and devices proposed to control the heat history of single crystals.

However, in conventional arts, the ascending and descending mechanism is installed on the after-heater. For the purpose of keeping the interior of a single-crystal lifting device at a vacuum state, connection structures of electric power supply become complicated.

When the after-heater is fixed, the installation location of the after-heater or the heat radiation location within the single-crystal lifting device is accordingly determined. However, this will cause the following problems.

(1) The heating conditions within the furnace will change with the lifting conditions such as melt level, the introducing conditions of atmosphere gas. However, and the above arrangement can not respond rapidly to changes in the above-mentioned heating conditions.

(2) FIG. 6 is a graph showing temperature variations at different lengths of a single crystal being lifted. The graph is drafted for the purpose of showing temperature variations at different portions of a single crystal being lifted by a semiconductor single-crystal manufacturing device which is provided with a heat-shielding cylinder near the melt surface so as to shield a single crystal being lifted from radiation heat. As shown in FIG. 6, the gradients of temperature graphs along longitudinal axis of the single crystal being lifted become gentle following the increase of the length of the single crystal. The conventional arts can not provide any solution to respond to gradient changes.

SUMMARY OF THE INVENTION

To solve the above problem, the object of the present invention is to provide a device and a method for manufacturing semiconductor single crystals. According to this invention, rapid responses to the changes heating conditions within a furnace can be made and temperature gradient of single crystals being lifted can be controlled. Therefore, high-quality semiconductor single crystals with low as-grown defect density and excellent gate oxide film integrity can be obtained.

To achieve the above object of the present invention, according to this invention, in a device for manufacturing semiconductor single crystals by utilizing the CZ method, the device is provided with an after-heater surrounding the single crystal being lifted and a heat-retaining cylinder capable of ascending and descending installed between the single crystal being lifted and the after-heater.

According to the above structure, the heat-retaining cylinder is installed within a conventional after-heater. Due to the fact that the heat-retaining cylinder can be elevated and lowered, two parameters, namely output of the after-heater and the location of the heat-retaining cylinder, can be used to control the heat history of single crystals produced.

Furthermore, according to this invention, in the process of manufacturing semiconductor single crystals by utilizing the CZ method, the heat history of single crystals being lifted can be controlled by adjusting the output of the after-heater and the location of the heat-retaining cylinder.

In the process of this invention, any selected portion of the single crystal being lifted can be sheltered by the heat-retaining cylinder to prevent it from heat dissipation, so that the single crystal can be slowly cooled down. The heat-retaining cylinder is heated by the after-heater disposed at a determined location to enhance the effect of slowly cooling down. Therefore, if the output of the after-heater and the location of the heat-retaining cylinder are adjusted in response to the length of the single crystal lifted, the temperature gradient of the specific temperature range through the total length of a single crystal can be controlled within a desired range to reduce the as-grown defect density of the single crystal. Furthermore, this invention can timely respond to changes of the lifting conditions such as melt level, the introducing conditions of atmosphere gas. Thus, the present invention can control the heat history with a wide range and high precision in comparison with in a case of using only after-heater.

Furthermore, in the process of this invention the single crystal is maintained in the range of from 1000° C. to 1200° C. for more than one hour during lifting operation.

The as-grown defects of single-crystal silicon are brought about by the change of balance between numbers of interstitial silicon atoms and holes existing in the lattice. Sizes and densities of the defects have already been determined by the cooling rate in the range of from 1000° C. to 1200° C. In this invention, the portion of the single crystal falling from 1200° C. to 1000° C. is controlled to cool down slowly by way of the after-heater and the heat-retaining cylinder. Therefore, the as-grown deflect density can be reduced and the yield with respect to gate oxide film integrity can also be enhanced. Consequently, high-quality single crystals with excellent gate oxide film integrity can be obtained.

Furthermore, the characteristics depending on the heat history, such as the precipitation oxygen amount and the bulk micro defect (BMD), can be made even along the longitudinal axis of the single-crystal silicon.

BRIEF DESCRIPTION OF THE DRAWINGS

The present invention can be more fully understood by reading the subsequent detailed description and examples with references made to the accompanying drawings, wherein.

DETAILED DESCRIPTION OF THE PREFERRED EMBODIMENT

Figure 1:
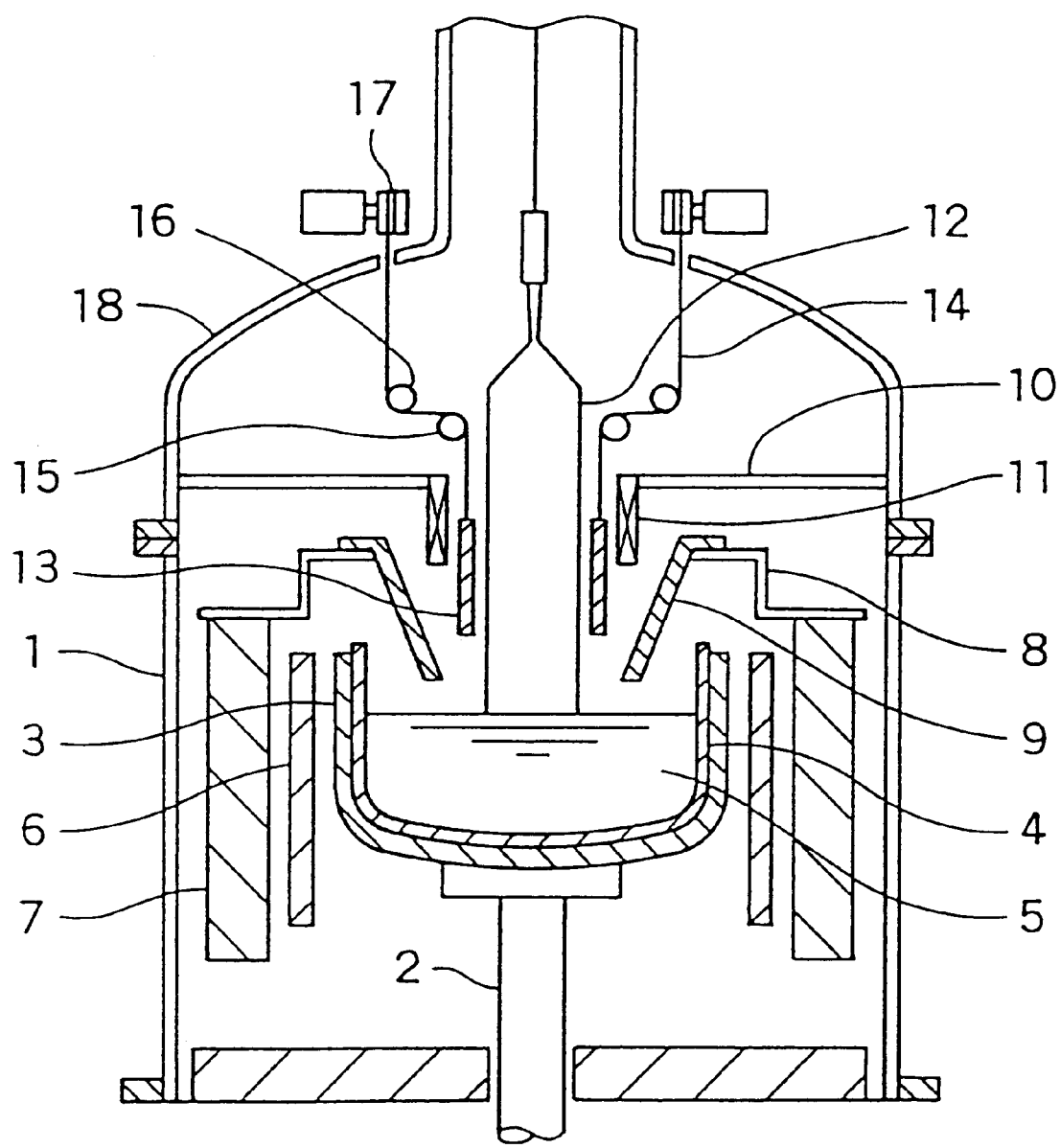
FIG. 1 is a partial crossed-sectional diagram showing the schematic structure of an apparatus according to this invention, for manufacturing semiconductor single crystals.

The present invention can be more fully understood by reading the detailed description and embodiments with references made to the accompanying drawings. FIG. 1 is a partial crossed-sectional diagram showing the schematic structure of an apparatus according to this invention, for manufacturing semiconductor single crystals. As shown in FIG. 1, at the central portion of a main chamber 1, a graphite crucible 3 is installed on a crucible shaft 2 capable of rotating, ascending, and descending. Melted liquid 5 of polycrystalline silicon lumps is stored in a quartz crucible 4 accommodated within the graphite crucible 3. A cylindrical main heater 6 and acylindrical adiabatic cylinder 7 are disposed around the graphite crucible 3. A reversed frustrated cone-shaped heat-shielding sleeve 9 is mounted on the top of the adiabatic cylinder 7 via a support member 8.

A support member 10 serving as an electrode is mounted on a predetermined location above the heat-shielding sleeve 9. A cylindrical after-heater 11 is mounted on the support member 10. A heat-retaining cylinder 13 made of graphite, SiC, Mo, or the like is disposed between the after-heater 11 and the single crystal 12 being lifted. The heat-retaining cylinder 13 is capable of ascending and descending. The inner diameter of the after-heater 11 is 1.1–1.5 times the outer diameter of the heat-retaining cylinder 13, while the inner diameter of the heat-retaining cylinder 13 is 1.1–1.5 times the diameter of the single crystal 12. Three or four wires 14 are engaged with the upper end of the heat-retaining cylinder 13. Each wire 14 is respectively wounding around a drum 17 engaging with a motor, by way of pulleys 15 and 16. Each drum 17 is installed outside an upper chamber 18. The heat-retaining cylinder 13 can be raised or lowered along the single crystal 12 by controlling the rotation speed of the drums 17. Furthermore, a temperature sensor for detecting the temperature of the single crystal 12 is mounted on the heat-retaining cylinder 13, the heat-retaining cylinder 13 is controlled to ascend or descend with reference to the detected value of the temperature sensor.

The heat-shielding sleeve 9 is not an indispensable element for reducing the as-grown defect density, however it is preferable to install it if single crystals with low oxygen density are to be produced. The heat-shielding sleeve 9 is employed for controlling the density of oxygen entering single crystals.

Figure 2:
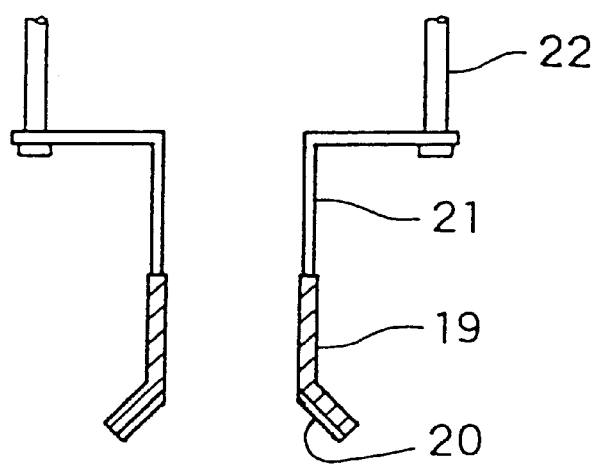
FIG. 2 is a longitudinal crossed-sectional diagram showing a second embodiment of the heat-retaining cylinder.

FIG. 2 is a longitudinal crossed-sectional diagram showing a second embodiment of the heat-retaining cylinder, wherein the lower portion of the heat-retaining cylinder 19 is enlarged in a cone-shaped. A reflection plate 20 made of molybdenum steel or stainless steel is installed on the inner surface of the tapered portion. Radiation heat from the melt surface is reflected by the reflection plate 20 and radiates on a predetermined portion of the single crystal to enhance the heat-retaining effect of the portion. Therefore, the fragment of the single crystal, surrounded by the lower portion of the heat-retaining cylinder 19 has a better slow cooling-down effect than that surrounded by the upper portion of the heat-retaining cylinder 19.

Furthermore, a plurality of supporting members 21 made of carbon composite material are mounted on the top of the heat-retaining cylinder 19. The upper ends of the ascending and descending shafts 22 engaged with support members 21 are connected with an ascending and descending mechanism (not shown) installed outside the upper chamber. Wobbling during ascending or descending can be definitely prevented by supporting the heat-retaining cylinder 19 with support members 21. The support members 21 can be connected with the heat-retaining cylinder 13 of the first embodiment by way of the ascending and descending shafts 22.

Figure 3:
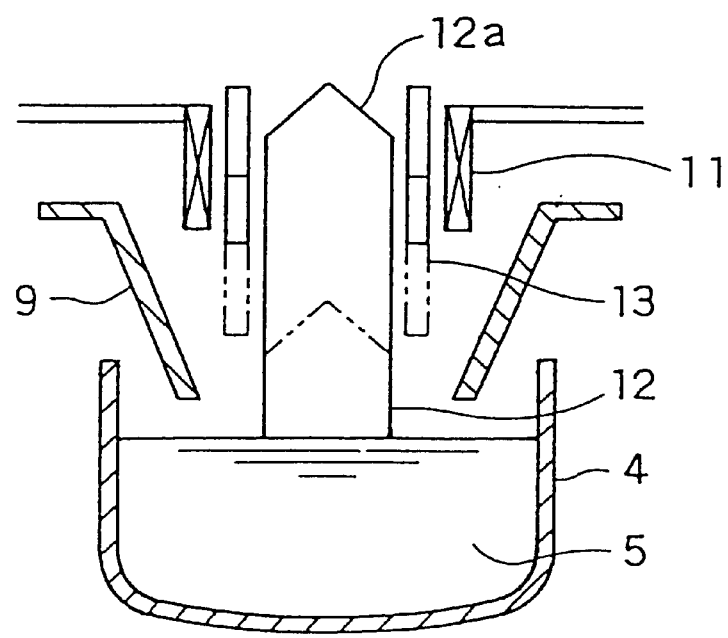
FIG. 3 is a diagram showing the adjustment of the location of the heat-retaining cylinder.

The processes for manufacturing semiconductor single crystals by using the above devices are as follows. In the initial stage of lifting the single crystal 12, the heat-retaining cylinder 13 is lowered to its lowermost location, as indicated by the dotted line in FIG. 3. Then, electric power is supplied to the after-heater 11. The single crystal 12 being lifted begins to cool down slowly from its shoulder 12a by the aid of the heat-retaining cylinder 13 and the after-heater 11. Then, the output of the after-heater 11 and the location of the heat-retaining cylinder 13 are controlled to keep the single crystal 12 passing through a zone having temperature between 1000° C. and 1200° C. for more than one hour.

Following the proceeding of growing the single crystal 12, as the length of the single crystal 12 increases, the heat-retaining cylinder 13 gradually elevates to a predetermined location. When the body of the single crystal reaches a predetermined length, the heat-retaining cylinder 13 is kept at a predetermined location indicated by solid lines in FIG. 3. Through the above operation, the heat-retaining cylinder 13 is kept at a location so that the temperature of the single crystal 12 within the heat-retaining cylinder 13 is constantly between 1000° C. and 1200° C.

Atmosphere gas such as Argon is introduced from the upper portion of the upper chamber 18. The atmosphere gas flows through the gap between the after-heater 11 and the heat-retaining cylinder 13, then flows through the gap between the single crystal 12 and the heat-retaining cylinder 13. The atmosphere gas then passes through the gap between the lower portion of the heat-shielding sleeve 9 and the melted liquid 5. Subsequently, the atmosphere gas flows upwardly along the inner wall of the quartz graphite 4. Subsequently, the atmosphere gas flows through the gap between the graphite crucible 3 and the main heater 6 and exhausted out from the main chamber 1 through the gap between the main heater 6 and the adiabatic cylinder 7. While passing the gap between the heat-shielding sleeve 9 and the melt liquid 5, the speed of atmosphere gas is raised so as to blow and get rid of the SiO evaporated from the melted liquid 5.

Figure 4:
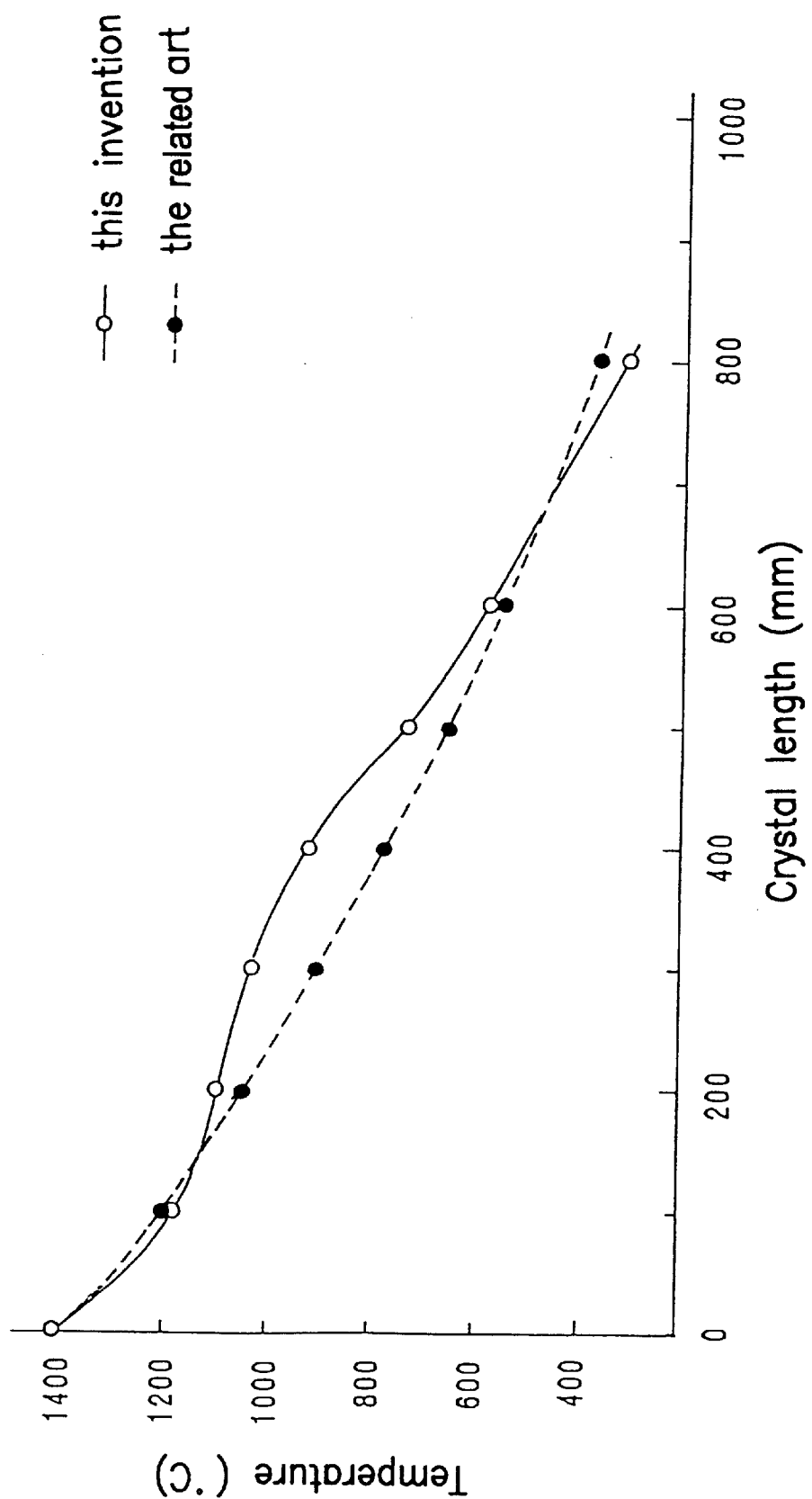
FIG. 4 is a comparative graph showing the temperature changes at various lengths of single crystals respectively produced by a conventional semiconductor single-crystal device having a heat-shielding sleeve only and a semiconductor single-crystal device of this invention.

FIG. 4 is a comparative graph showing the temperature changes at various lengths of single crystals respectively produced by a conventional semiconductor single-crystal device having a heat-shielding sleeve only and a semiconductor single-crystal device of this invention. As the effect of slow cooling-down by the aid of the after-heater and the heat-retaining cylinder in this invention, the temperature gradients in the crystal temperature zone in the range of from 1000° C. to 1200° C. according to this invention are smaller than those according to conventional methods.

Figure 5:
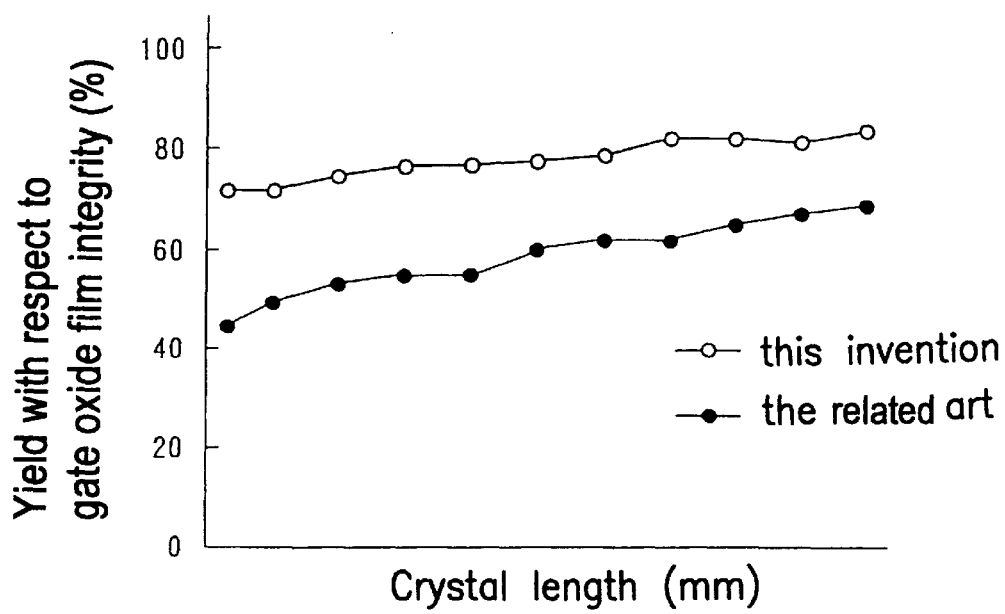
FIG. 5 is a comparative graph showing the yield with respect to gate oxide film integrity at various locations along the longitudinal axes of single crystals produced respectively according to the related art and this invention.
Figure 6:
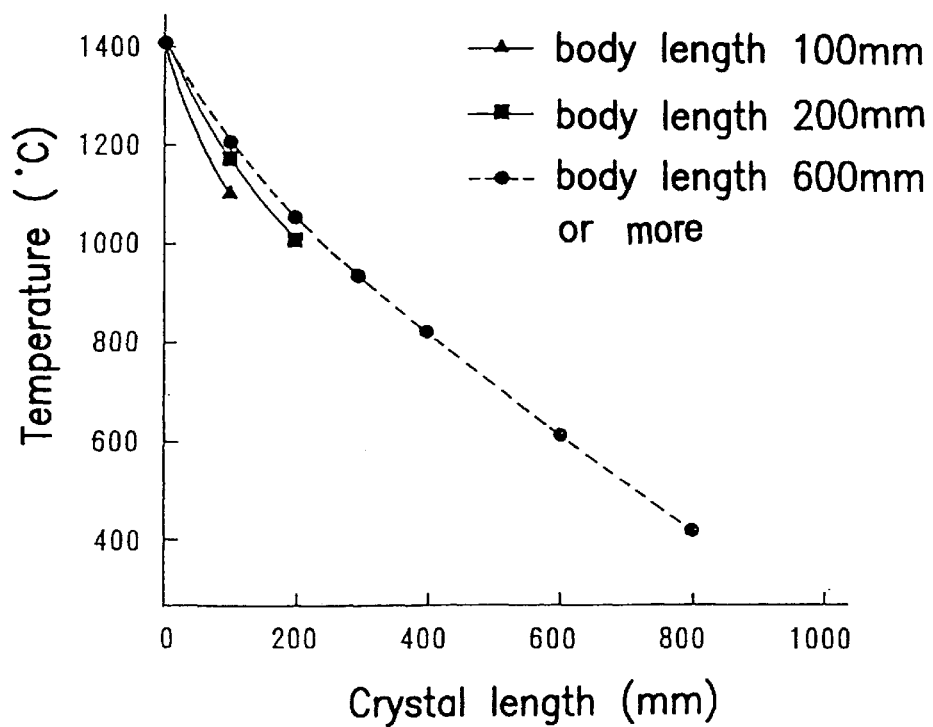
FIG. 6 is a graph showing temperature variations at different lengths of a single crystal being lifted.

FIG. 5 is a comparative graph showing the yield with respect to gate oxide film integrity at various locations along the longitudinal axes of single crystals produced respectively according to therelated art and this invention. The evaluation of gate oxide film integrity is performed by firstly setting 100–200 measure points on a surface of a silicon wafer sliced from a single crystal. Then, evaluation of dielectric breakdown of oxide film and evaluation of the silicon wafer quality are carried out at each measure point. In the evaluation of dielectric breakdown of oxide film, in case the leakage current density is larger than $10.0 \mu A/cm^2$, then the insulation of oxide film is considered to have failed.

In the evaluation of the silicon wafer quality, if insulation of oxide film fails under an electric field having average strength less than 8 MV/cm, then the measure point of the silicon wafer quality is considered to be bad. Furthermore, the yield is calculated by the number of the passed measure points existing on the wafer surface. The accepted percentage of single crystals produced according to this invention is 15% higher than that produced according to related arts in which only heat-shielding sleeves are provided to the manufacturing devices. Furthermore, the yield is made even along the crystal axis. The above result is due to the fact that the heat-retaining cylinder is capable of ascending and descending and temperature gradient of the whole single crystal, along its crystal axis, is controlled to be unchanged.

According to this invention, in the device for manufacturing semiconductor single crystals by using the CZ method, the heat history of a single crystal can be controlled by combining the after-heater and the heat-retaining cylinder capable of ascending and descending, so as to slowly cool down a specified portion of the single crystal at a temperature between 1000° C. and 1200° C. for more than one hour. Therefore, if the above process is performed throughout the whole length of the single crystal, then single crystals with low as-grown defect density and excellent gate oxide film integrity can be obtained. Furthermore, if the output of the after-heater and the location of the heat-retaining cylinder are properly adjusted, rapid respond to the changes of various lifting conditions can be achieved. In addition, the device according to this invention is uncomplicated and low-priced.

What is claimed is:

1. A device for manufacturing semiconductor single crystals by utilizing the CZ method, comprising:

a rotatable crucible;

a cylindrical after-heater disposed above the crucible; and a heat-retaining cylinder installed inside the after-heater, wherein the heat-retaining cylinder surrounds the single crystal being lifted, and wherein the heat-retaining cylinder can be moved up and down.

2. A device according to claim 1, wherein the heat-retaining cylinder has a tapered portion at a lower portion thereof and an inner surface of the tapered portion has a reflection plate.

3. A device according to claim 1, wherein the heat-retaining cylinder has a plurality of support members connected with an ascending and descending mechanism, the plurality of support members being made of carbon composite material.

4. A device according to claim 1 further comprising a main heater.

5. A device according to claim 1 wherein an inner-diameter of the after-heater is 1.1–1.5 times an outer diameter of the heat retaining cylinder.

* * * * *